(12) United States Patent
Himmer (10) Patent No.: US 9,842,979 B2
(45) Date of Patent: Dec. 12, 2017

(54) THERMOELECTRIC DEVICE

(71) Applicant: MAHLE International GmbH, Stuttgart (DE)

(72) Inventor: Thomas Himmer, Reichenbach (DE)

(73) Assignee: MAHLE International GmbH, Stuttgart (DE)

( * ) Notice: Subject to any disclaimer, the term of this patent is extended or adjusted under 35 U.S.C. 154(b) by 0 days.

(21) Appl. No.: 14/619,622

(22) Filed: Feb. 11, 2015

(65) Prior Publication Data

US 2015/0155465 A1    Jun. 4, 2015

Related U.S. Application Data (63) Continuation of application No. PCT/EP2013/066968, filed on Aug. 14, 2013.

(30) Foreign Application Priority Data

Aug. 17, 2012    (DE) .......................... 10 2012 214 702

(51) Int. Cl.
| | |
|---|---|
| *H01L 35/32* | (2006.01) |
| *F01N 5/02* | (2006.01) |
| *H01L 35/30* | (2006.01) |

(52) U.S. Cl.
CPC .............. *H01L 35/32* (2013.01); *F01N 5/025* (2013.01); *H01L 35/30* (2013.01); *Y02T 10/16* (2013.01)

(58) Field of Classification Search
CPC .......... H01L 35/32; H01L 35/30; F01N 5/025
See application file for complete search history.

(56) References Cited

U.S. PATENT DOCUMENTS

| | | |
|---|---|---|
| 3,539,399 A | 11/1970 | Harvey |
| 6,474,060 B2 | 11/2002 | Khair |
| 7,100,369 B2 | 9/2006 | Yamaguchi et al. |
| 7,612,446 B2 | 11/2009 | Dang et al. |
| 8,110,736 B2 | 2/2012 | Iwanade et al. |
| 9,291,375 B2 | 3/2016 | Brehm et al. |
| 2004/0076214 A1 | 4/2004 | Bell |
| 2009/0236087 A1 | 9/2009 | Horio |

(Continued)

FOREIGN PATENT DOCUMENTS

| | | |
|---|---|---|
| CN | 101188217 A | 5/2008 |
| CN | 101515628 A | 8/2009 |
| CN | 101553704 A | 10/2009 |

(Continued)

OTHER PUBLICATIONS

Machine Translation EP 2230701.*

(Continued)

*Primary Examiner* — Shannon Gardner
(74) *Attorney, Agent, or Firm* — Muncy, Geissler, Olds & Lowe, P.C.

(57) ABSTRACT

A thermoelectric device having a flat tube, a first thermoelectric module, and a second thermoelectric module. The thermoelectric modules each have a housing that includes at least two opposite first walls. A plurality of thermoelectric elements is arranged between the first walls of the housing. The thermoelectric elements have opposite surfaces, each of which is in thermal contact with one of the first walls of the housing of the thermoelectric module.

14 Claims, 6 Drawing Sheets

(56) References Cited

U.S. PATENT DOCUMENTS

2010/0031987 A1 2/2010 Bell et al.

FOREIGN PATENT DOCUMENTS

| | | |
|---|---|---|
| CN | 102239579 A | 11/2011 |
| DE | 40 06 861 A1 | 9/1991 |
| DE | 10 2006 037 540 A1 | 2/2007 |
| DE | 10 2006 040 283 A1 | 3/2007 |
| DE | 10 2009 013 535 A1 | 9/2010 |
| DE | 10 2009 025 033 A1 | 12/2010 |
| EP | 1 475 532 A2 | 11/2004 |
| EP | 1 230 475 B1 | 3/2006 |
| EP | 2 230 701 A2 | 9/2010 |
| EP | 2 262 018 A2 | 12/2010 |
| JP | H10-281015 A | 10/1998 |
| JP | H11-036981 A | 2/1999 |
| JP | 2000-282960 A | 10/2000 |
| JP | 2003-204087 A | 7/2003 |
| JP | 2004-068608 A | 3/2004 |
| JP | 2005-083251 A | 3/2005 |
| JP | 2005-117836 A | 4/2005 |
| JP | 2008-277584 A | 11/2008 |
| JP | 2009-260173 A | 11/2009 |
| RU | 2 142 177 C1 | 11/1999 |
| WO | WO 98/56047 A1 | 12/1998 |
| WO | WO 2007/026432 A1 | 3/2007 |
| WO | WO 2011/082912 A | 7/2011 |

OTHER PUBLICATIONS

Chinese Office Action for Chinese Application No. 201380043859.4 dated Aug. 1, 2016 with English translation.
Chinese Office Action for Chinese Application No. 201380043912.0 dated Aug. 25, 2016 with English translation.
Chinese Office Action for Chinese Application No. 201380043859.4 dated Feb. 27, 2017 with English translation.

* cited by examiner

THERMOELECTRIC DEVICE

This nonprovisional application is a continuation of International Application No. PCT/EP2013/066968, which was filed on Aug. 14, 2013, and which claims priority to German Patent Application No. DE 10 2012 214 702.0, which was filed in Germany on Aug. 17, 2012, and which are both herein incorporated by reference.

BACKGROUND OF THE INVENTION

Field of the Invention

The present invention relates to a thermoelectric device having a flat tube and a first thermoelectric module and a second thermoelectric module, whereby the thermoelectric modules each have a housing with at least two opposite first walls, whereby a plurality of thermoelectric elements are arranged between the first walls of the housing, whereby the thermoelectric elements have opposite surfaces, which in each case are in thermal contact with one of the first walls of the housing of the thermoelectric module. In addition, the invention relates to an arrangement of a thermoelectric device in a heat exchanger.

Description of the Background Art

In motor vehicles a major part of the energy stored in fuel is converted to heat. Apart from being used for heating the interior, for example, the heat is also released partially unused via the exhaust gas.

This has a negative influence on the overall efficiency of the vehicle. In order to increase the efficiency and thereby to reduce $CO_2$ emissions during operation, it is worthwhile to make the energy bound in the exhaust gas utilizable.

The use of thermoelectric devices is necessary to achieve this. These thermoelectric devices have thermoelectrically active materials, which allow the generation of electrical energy. For this purpose, the thermoelectric materials should be exposed to a temperature difference.

The exhaust gas line lends itself as a hot source particularly in the motor vehicle. The exhaust gas temperatures are sufficiently high over the entire exhaust gas line, so that a thermoelectric device can be integrated at many locations in the exhaust gas line.

A coolant stream of the vehicle, for example, lends itself as a cold source. For this purpose, either an already present coolant circuit can be expanded, or if necessary an additional circuit can be integrated.

The publications EP 1230475 B1 (which corresponds to U.S. Pat. No. 6,474,060), EP 1475532 A2 (which corresponds to U.S. Pat. No. 7,100,369), WO 2007026432, JP 10281015AA, JP 2000282960AA, JP 2004068608AA, JP 2005083251AA, or JP 2005117836AA in fact disclose approaches by using such a thermoelectric device; however, these implementations are not very efficient because of the disadvantageous connection of the thermoelectric modules to a heat exchanger.

To assure an especially efficient use of a thermoelectric device, it is very important that the thermoelectric elements within the thermoelectric modules are connected especially advantageously to the fluids. In particular, a low heat transfer coefficient is advantageous to be able to produce the maximum benefit from the temperature difference of the two fluids, or in an alternative design to realize the most effective heat pump possible with as low a current consumption as possible.

At present, particularly disadvantageous in the prior art is the connection of the thermoelectric elements to the fluid, particularly with respect to a lowest possible thermal resistance between the fluids and the thermoelectrically active materials. In addition, the resistance to thermal stresses in the connecting material or the thermoelectric modules themselves has not been optimally resolved. Furthermore, the integratability of the thermoelectric modules in a heat exchanger, for example, has not been optimally resolved thus far.

SUMMARY OF THE INVENTION

It is therefore an object of the present invention to provide a thermoelectric device that produces a lowest possible thermal resistance between the fluids and the thermoelectric elements and also is as insensitive as possible to thermal stresses and can be easily integrated into a heat exchanger.

An exemplary embodiment of the invention relates to a thermoelectric device having a flat tube and at least one first thermoelectric module, whereby the thermoelectric module has a housing with at least two opposite first walls, whereby a plurality of thermoelectric elements are arranged between the first walls of the housing, whereby the thermoelectric elements have opposite surfaces, which in each case are in thermal contact with one of the first walls of the housing of the thermoelectric module, whereby the flat tube has at least two opposite second walls, whereby the thermoelectric module is arranged in the interior of the flat tube, and with one of the first walls thereof is in thermal contact with a second wall of the flat tube, and the thermoelectric module is connected via side walls to a second wall, whereby a flow channel, through which a first fluid can flow, is formed between the housing of the thermoelectric module and the side walls and the second wall.

A further exemplary embodiment relates to a thermoelectric device having a flat tube and a first thermoelectric module and a second thermoelectric module, whereby the thermoelectric modules each have a housing with at least two opposite first walls, whereby a plurality of thermoelectric elements are arranged between the first walls of the housing, whereby the thermoelectric elements have opposite surfaces, which in each case are in thermal contact with one of the first walls of the housing of the thermoelectric module, whereby the flat tube has at least two opposite second walls, whereby the thermoelectric modules are arranged in the interior of the flat tube, and with one of the first walls thereof are in thermal contact with in each case a second wall of the flat tube and the thermoelectric modules are connected to one another via side walls, whereby they form a flow channel, through which a first fluid can flow, between the housing of the thermoelectric modules and the side walls.

By the combination of the thermoelectric elements in a housing and the electrical connection of the elements among one another to a thermoelectric module, it is especially easy to use a plurality of thermoelectric elements together and to expose them to a temperature gradient. Furthermore, the arrangement of the thermoelectric elements within the housing provides additional protection for the thermoelectric elements from damaging effects from outside, such as impacts or corrosive media, for instance.

The arrangement of the thermoelectric module or thermoelectric modules within the flat tube, moreover, provides protection for the thermoelectric modules themselves from damaging external influences.

In particular, if the first fluid within the flow channel has a high temperature, this can result in increased stress on connection sites. Because the thermoelectric modules are in contact via the first walls, facing away from the flow channel, with the second walls of the flat tube, a relatively large distance is achieved between the hot first fluid and the connection site. This leads to relief for the connection sites between the thermoelectric modules and the flat tube.

Furthermore, a first wall of the housing of a thermoelectric module facing the flow channel can have a cutout, whereby the cutout is closed fluid-tight via a sealing element.

Such a cutout can be advantageous particularly for equalizing arising thermal stresses. These thermal stresses arise substantially due to the temperature gradient between a first fluid within the flow channel and a second fluid, which flows outside of the thermoelectric device.

Also, a first wall of the housing of a thermoelectric module facing the flow channel can have flow resistance elements projecting into the flow channel.

The interface surface exposed to the fluid is increased by the arrangement of the flow resistance elements at one of the interfaces of the flow channel, which results in an improved heat transfer.

According to an alternative exemplary embodiment, the side walls can form a thermal decoupling element.

The heat loss to the outside can be reduced by a thermal decoupling element. A decoupling element hereby in the simplest case can be realized by an air-filled hollow space.

The thermoelectric elements can be connected in series via conductive bridges, whereby the conductive bridges are arranged between the thermoelectric elements and the first walls of the housing.

A series connection of the thermoelectric elements increases the efficiency of the thermoelectric device, as the obtained electrical energy includes an addition of the obtained electrical energy to the individual thermoelectric elements.

The connection of the thermoelectric elements via conductive bridges to the first walls is advantageous, as the conductive bridges function as an intermediate medium, which to some extent can take up the possibly arising stresses and thus relieve the sensitive thermoelectric elements.

It is expedient furthermore for the first wall of the housing facing away from the flow channel, and a second wall of the flat tube are formed separated from one another and are in thermal contact with one another or the first wall of the housing facing away from the flow channel and the second wall of the flat tube are formed as a unit.

In the case of a separated design, thermal contact between the walls is especially advantageous, because the thermal efficiency of the thermoelectric device can be increased by a possibly optimal thermal contact.

In an embodiment of the first wall and the second wall as a unit, the thermal connection is still more advantageous, because the thermal resistance is usually lower here than it is in an arrangement of two walls that are in thermal contact with one another.

A second wall of the flat tube can have a cutout.

A second fluid that flows around the flat tube can flow over the thermoelectric module directly via such a cutout in the second wall. This reduces the thermal resistance, since the heat transfer need not occur through an additional wall. In addition, a cutout can also result in relief with respect to thermal stresses.

In an embodiment of the invention, it may be provided that the flat tube can be formed as a single piece.

A one-piece flat tube is easy and cost-effective to produce with currently available production techniques. Furthermore, a one-piece tube has the advantage that the number of joining sites is low and thus the probability of leakage at one of the joining sites is lower.

The flat tube can be formed from a plurality of substantially plate-like elements in a stacked configuration.

A multipart design is advantageous, among others with respect to the assembly of the elements arranged in the flat tube. The elements arranged in the flat tube can be assembled prior to the flat tube being finished. The phrase, substantially plate-like elements, is taken to mean elements with a predominant plate-like surface in relation to the overall dimensions. It is completely foreseeable that angled edge regions adjoin these plate-like surfaces, or a flange region connected to the plate-like surface.

According to a further alternative exemplary embodiment, it is to be preferred for a diffuser that conveys the fluid flow into and/or out of the flow channel, to be arranged before and/or after the thermoelectric modules, when viewed in the flow direction of the flow channel.

By the arrangement of a diffuser before and/or after the thermoelectric modules, the first fluid flowing through the flow channel can be concentrated before entering the flow channel and spread out again after leaving the flow channel. The diffuser forms inflow inclines for this purpose.

Pressure losses in the fluid can also be reduced by the diffuser, since the diffuser assures a continuous step-free transition from the cross-section of the flat tube to the cross-section of the flow channel.

In addition, the diffuser also creates a thermal insulation of the side regions of the thermoelectric modules relative to the first fluid. An optimal effect of the thermoelectric module is achieved when a greatest possible temperature difference is achieved between the first wall facing the flow channel and the first wall facing away from the flow channel. Exposure of the side regions of the thermoelectric module to the first fluid can result in a decrease in the maximally possible temperature difference, which reduces the efficiency of the thermoelectric device.

Furthermore, a diffuser prevents direct contact of the first fluid with the connection site between the thermoelectric module and the flat tube, which is beneficial for the durability of the connection.

An exemplary embodiment of the invention relates to an arrangement of one or more thermoelectric devices in a heat exchanger, whereby a first fluid flows through the flow channel and a second fluid flows around the flat tube on its outer interfaces facing away from the flow channel.

The arrangement of the thermoelectric devices in a heat exchanger represents an especially simple manner of use. The thermoelectric devices can be accommodated like customary tubes with their flat tubes in a tube sheet of a heat exchanger. In this case, a first fluid can flow through collecting tanks connected to the tube sheets, into the flow channels of the thermoelectric devices. In this regard, a second fluid can flow around the outer surfaces of the thermoelectric devices.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
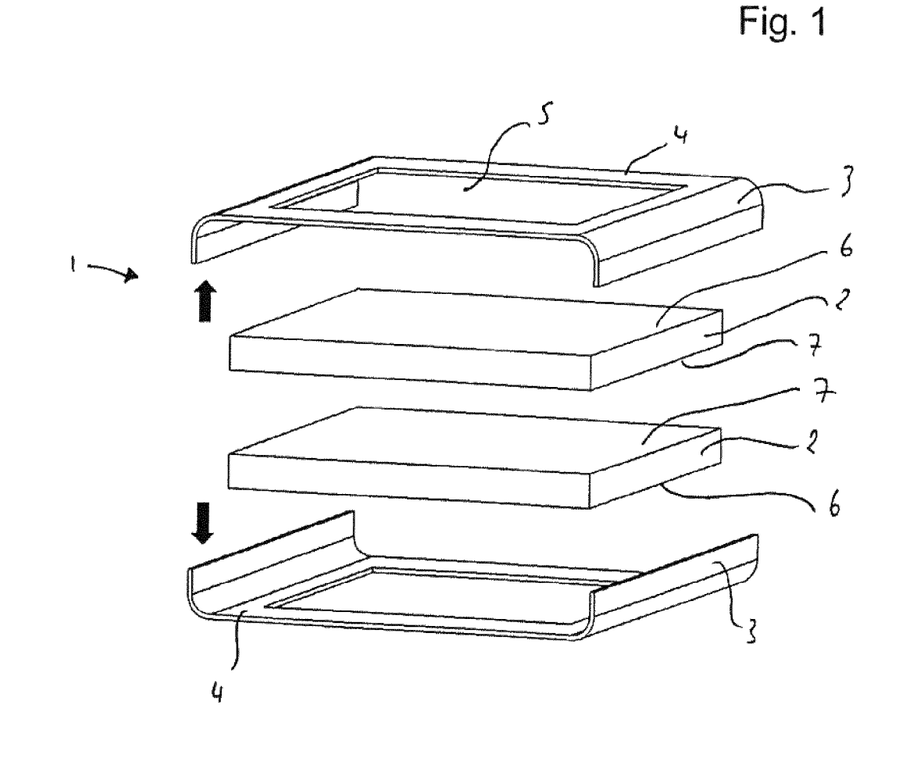
FIG. 1 shows an exploded illustration of a two-part flat tube with two thermoelectric modules arranged therebetween.

FIG. 1 shows an exploded illustration of a thermoelectric device 1. The thermoelectric device 1 includes substantially of a flat tube 8 that is formed from two U-shaped flat tube pieces 3. Two thermoelectric modules 2 are arranged between these U-shaped flat tube pieces 3. The thermoelectric modules have substantially two first walls 6, 7 lying parallel to one another. The two walls 7 of thermoelectric modules 2 here face one another. The respective other walls 6 of thermoelectric modules 2 face away from one another toward the outer side of thermoelectric device 1.

The two U-shaped flat tube pieces 3 each have a cutout 5, which is introduced in wall 4 of U-shaped flat tube piece 3. In the assembled state, walls 6 of thermoelectric module 2 are in thermally conductive communication with wall 4 of U-shaped flat tube piece 3. Methods such as welding, gluing, or soldering can be used to connect thermoelectric module 2 with U-shaped flat tube piece 3.

Figure 2:
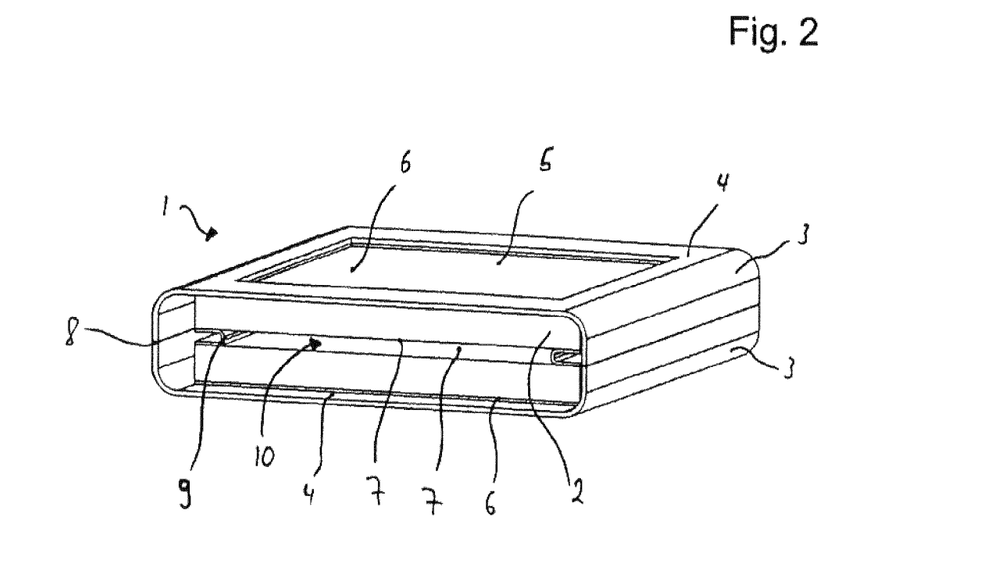
FIG. 2 shows a perspective view of the elements shown in FIG. 1 in the assembled state, with side walls arranged between the thermoelectric modules.

FIG. 2 shows the elements of FIG. 1 now in the final assembled state. It can be seen that the two U-shaped flat tube pieces 3 are placed one on top of the other at their legs. The two elements are connected together at the junction between the top and bottom U-shaped flat tube piece 3. The two flat tube pieces 3 together form flat tube 8.

In the interior of flat tube 8 thermoelectric modules 2 with their walls 6 are arranged at walls 4, which form the bottom region of U-shaped flat tube pieces 3, are arranged. Here the two thermoelectric modules 2 are connected together on the sides by side walls 9. In the case of the embodiment in FIG. 2, side walls 9 are formed by elements bent into U-shape. The side walls 9 space apart the two thermoelectric modules 2. Moreover, fluid-tight connections of the two thermoelectric modules 2 are produced by side walls 9, as a result of which flow channel 10 arising between thermoelectric modules 2 and side walls 9 forms.

Hollow spaces form to the left and right of thermoelectric modules 2 between thermoelectric modules 2 and the inner surfaces of flat tubes 8. The hollow spaces form a thermal insulation toward the outside, reducing the radiation of heat into the environment of thermoelectric device 1.

Particularly when the fluid being conveyed through flow channel 10 is a fluid with a high temperature, thermal insulation toward the outside is desirable to keep the temperature loss within thermoelectric device 1 as low as possible and to achieve a high efficiency.

Flat tube 8 can be constructed of metallic or ceramic materials, for example. In alternative embodiments, a one-piece design of the flat tubes can also be realized.

Thermoelectric device 1 of FIG. 2 is subjected to a temperature difference for the utilization according to the invention. To this end, a first fluid is conveyed through flow channel 10 and a second fluid thereby flows around thermoelectric device 1 and particularly wall 4, which has cutout 5. The second fluid thus flows directly over wall 6 of thermoelectric module 2.

In this case, the first fluid and the second fluid preferably exhibit as great a temperature difference as possible. Advantageously, the fluid flowing through flow channel 10 has a higher temperature than the second fluid. The result is that the connection sites of thermoelectric modules 2 with flat tube 8 are not directly subjected to the hot fluid, which is conducive to the durability of the connections.

Figure 3:
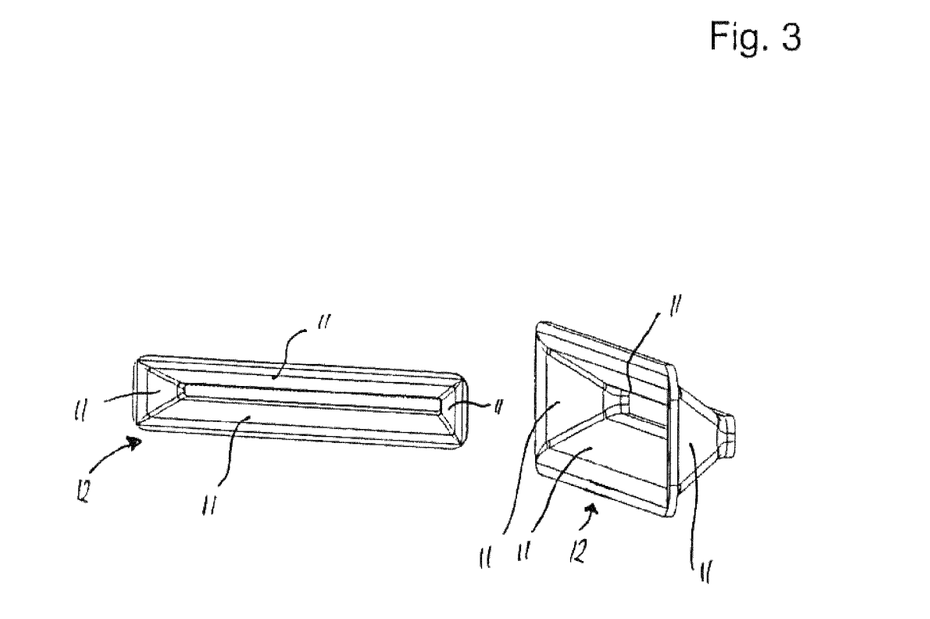
FIG. 3 shows a diffuser, as it can be arranged before and/or after the thermoelectric modules on the thermoelectric device, when viewed in the flow direction, in two perspective views.

FIG. 3 shows two perspective views of a diffuser 12. In the shown example the diffuser 12 is a deep-drawn element. Diffuser 12 has a tapered shape in cross section, resulting in a fluid flowing through diffuser 12 to be either concentrated or spread out.

The use of such a diffuser 12 is particularly helpful in reducing pressure gradients during the inflow of a fluid into thermoelectric device 1. The particular goal here is to produce as uniform and continuous a connection as possible between the cross section of flat tube 8 and the cross section of flow channel 10.

In addition, a thermal insulation effect can be achieved by diffuser 12, since the fluid flowing through thermoelectric device 1 cannot reach the side walls of thermoelectric modules 2, as the diffuser conveys the fluid directly into flow channel 10. A hollow space between the diffuser and the end faces of thermoelectric modules 2, which lie in the flow direction of the fluid, arises due to the use of a diffuser 12. The hollow space provides an additional thermal insulation effect.

Because the efficiency of thermoelectric modules 2 depends in particular on the temperature difference that prevails between wall 6 and wall 7 of a thermoelectric module 2, it is especially advantageous, when no additional heat input occurs on the side surfaces of thermoelectric module 2.

Figure 4:
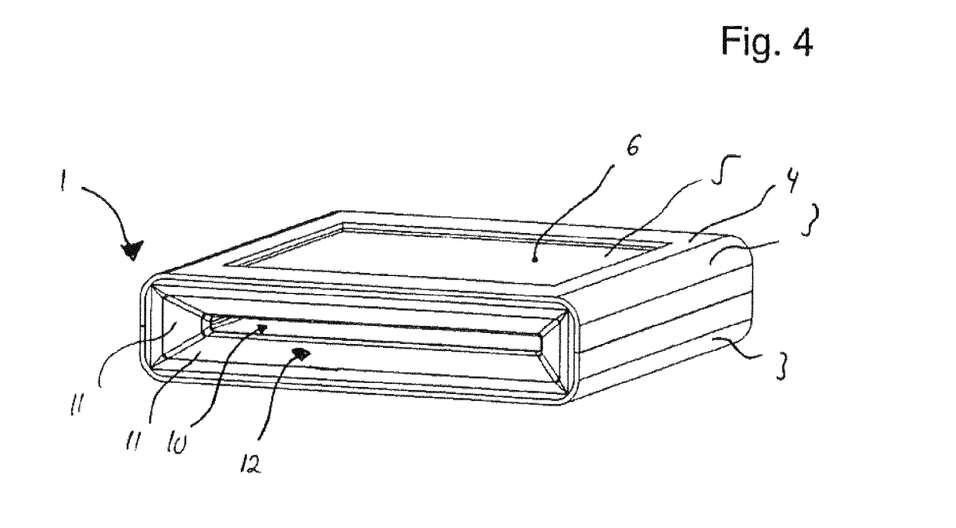
FIG. 4 shows a thermoelectric device as it is shown in FIG. 2 with inserted diffusers, as they are shown in FIG. 3.

FIG. 4 shows thermoelectric device 1 already shown in FIG. 2. In addition, in FIG. 4 diffuser 12 is inserted into flat tube 8 in the flow direction in front of thermoelectric modules 2. Therefore, when the fluid flows into thermoelectric device 1 it is conducted selectively into flow channel 10. The use of a second diffuser 12 in the outflow region of the flow channel is not shown in FIG. 4. There as well, the use can be advantageous for the aforementioned reasons.

Figure 5:
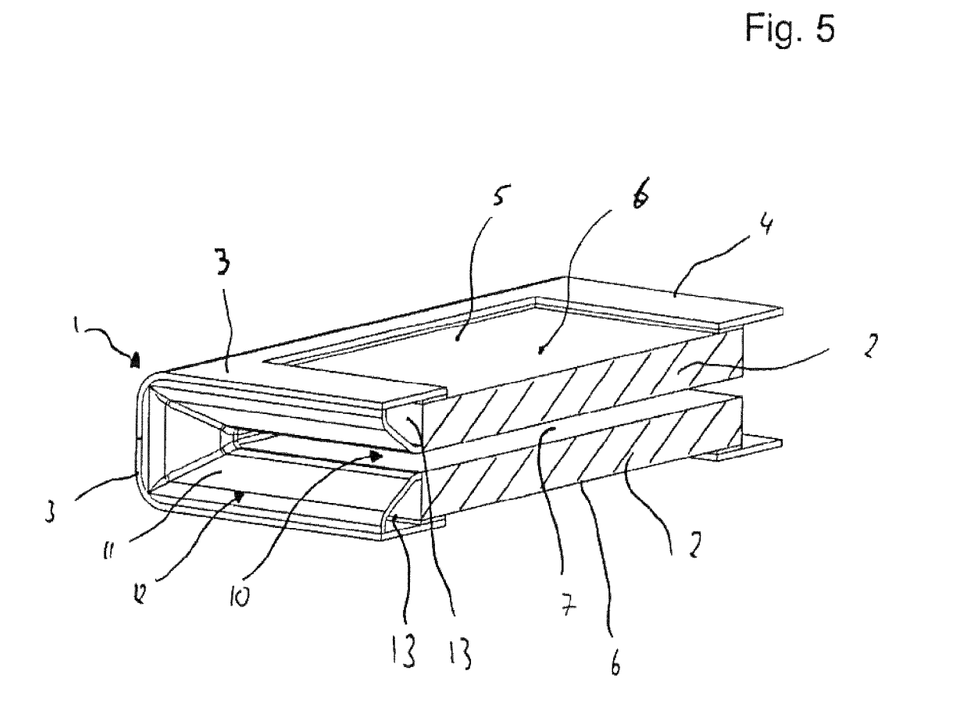
FIG. 5 shows a cut through the central plane along the flow channel in a thermoelectric device as shown in FIG. 4.

FIG. 5 shows a cut through a central plane of thermoelectric device 1. In FIG. 5 hollow space 13 can be seen which arises between diffuser 12 and thermoelectric module 2 in the inflow region. The hollow space 13 produces a thermal insulation of thermoelectric module 2 from the temperature of the fluid flowing through flow channel 10.

Thermoelectric elements, which are connected electrically to one another via conductive bridges and in each case are in thermal contact with the opposite walls 6 and 7 of thermoelectric modules 2, are arranged in the interior of thermoelectric modules 2. The thermoelectric elements and their conductive bridges are not shown in FIG. 5.

Figure 6:
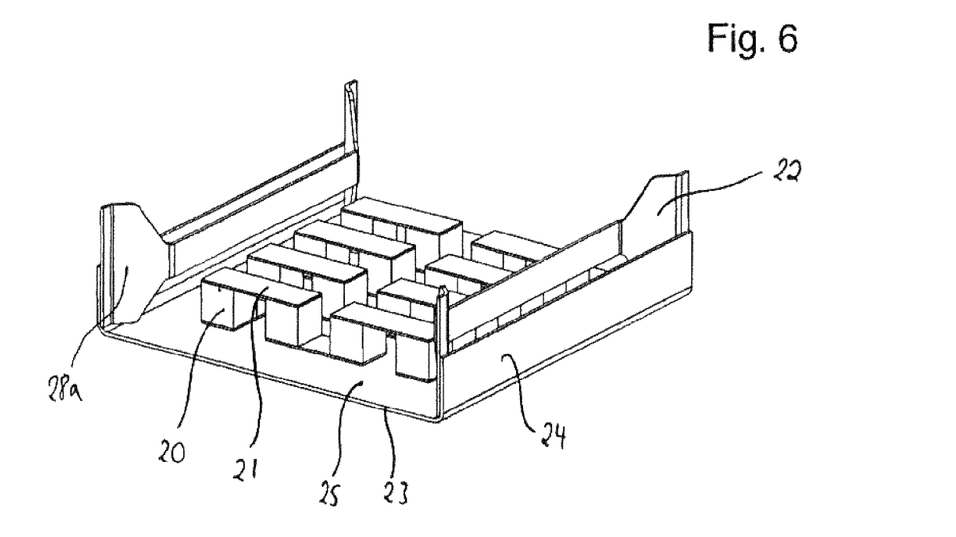
FIG. 6 shows a perspective view of an alternative embodiment of a thermoelectric device, with thermoelectric elements connected by conductive bridges and arranged on an inner surface of a two-part flat tube.

FIG. 6 shows an alternative embodiment of a thermoelectric device. The shown structure of thermoelectric device 1 is still incomplete in FIG. 6. In the following figures, the structure is completed stepwise and supplemented with alternative embodiments.

Flat tube 38 of the embodiment shown hereafter is also formed by two U-shaped flat tube pieces 24, which are placed one on top of the other and are connected together at the junction of their legs.

The U-shaped flat tube piece 24 has a bottom region 23 formed by wall 25. A plurality of thermoelectric elements 20 are arranged on the wall 25. These are connected together electrically with conductive bridges 21.

The number of thermoelectric elements shown in FIG. 6 is by way of example. Upward and downward deviations in the number are conceivable in alternative embodiments.

As a departure from the exemplary embodiment in FIGS. 1 to 5, thermoelectric module 39 is now an element not separately constructed from flat tube 38. Thermoelectric module 39 rather is an integral part of flat tube 38. The precise structure of thermoelectric modules 39 will be described in the following figures.

On the side to the right and left of the arrangement of thermoelectric elements 20, a side wall 22 is arranged in the interior of U-shaped flat tube piece 24. Side walls 22 on the inner surface of the leg of U-shaped flat tube piece 24 are connected thereto and form the side boundary of flow channel 40 in the finally assembled state. Side walls 22 are shaped to form lateral inflow inclines 28a in the flow direction before and after the arrangement of thermoelectric elements 20.

Figure 7:
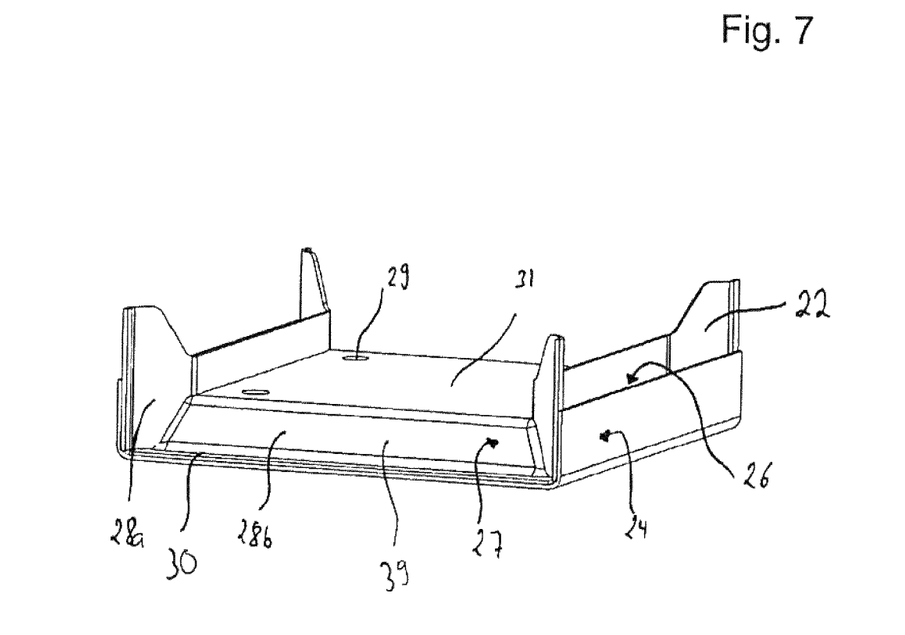
FIG. 7 shows a refinement of the thermoelectric device, shown in FIG. 6, with a cover which with the bottom part of the flat tube forms the housing of a thermoelectric module.

A development of thermoelectric device 1 of FIG. 6 is shown in FIG. 7. In addition to FIG. 6, now a cover 27 is placed over the arrangement of thermoelectric elements 20 and connected to U-shaped flat tube piece 24. Cover 27 is formed by a box-like element open in the direction of wall 25.

Cover 27 has on its area facing wall 25 a peripheral flange region 30, which forms the contact surface with wall 25. Furthermore, cover 27 has a conical cross section that tapers beginning from wall 25 to wall 31 forming the bottom of cover 27 and later the top or bottom boundary of flow channel 40. To this end, cover 27 has side walls placed in an inclined position. The inclined side walls of cover 27, which lie in the flow direction of flow channel 40, form the top or bottom inflow incline 28b. Together with inflow inclines 28a of side walls 22, the side walls of cover 27 form a diffuser which is similar to diffuser 12 from FIGS. 3 to 5.

In the interior of cover 27, thermoelectric elements 20 or conductive bridges 21 are in thermal contact with wall 31 of cover 27 and wall 25 of U-shaped flat tube piece 24. Wall 31 has electrical connection sites 29 by which thermoelectric elements 20 can be contacted electrically.

Thermoelectric module 39 is therefore formed by wall 25 of the U-shaped flat tube piece, cover 27, and thermoelectric elements 20 arranged therebetween and conductive bridges 21.

In conjunction with cover 27, side walls 22 now form a hollow space 26 between the upstanding leg of U-shaped flat tube piece 24 on the one side and side wall 22 and cover 27 on the other side. In the finally assembled state the hollow space 26 later serves as thermal insulation for the flow channel toward the outside. And it reduces the heat radiation losses of thermoelectric device 1.

Side walls 22 with cover 27 furthermore form inflow inclines 28a, 28b, which concentrate the fluid flow in the flow channel in the inflow region of thermoelectric device 1 and spread it out again in the outflow region. The shape of cover 27 and side walls 22 thus forms a diffuser that reduces pressure losses in the inflow and outflow region and in addition forms a thermal insulation of the side surfaces of thermoelectric elements 20 from the inflowing fluid.

Figure 8:
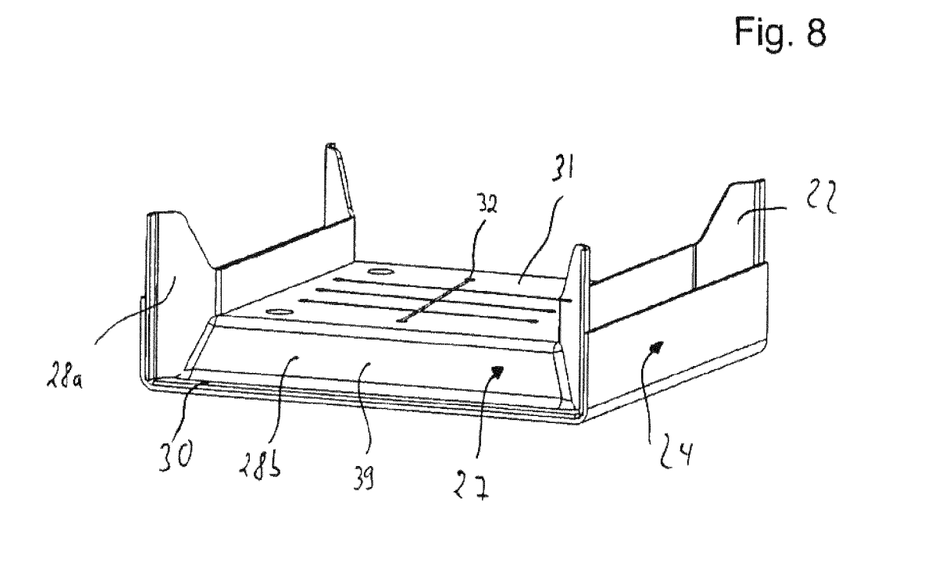
FIG. 8 shows an alternative embodiment of the thermoelectric device of FIG. 7, whereby the cover has a cutout in its wall directed to the center of the flat tube.

FIG. 8 shows a structure similar to FIG. 7. As a departure from FIG. 7, wall 31 of cover 27 now has a cutout 32 in addition.

Cutout 32 serves here to take up forces, which may arise in wall 31 due to thermal strain. This is conducive in particular for relieving thermoelectric elements 20, which are arranged between cover 27 and wall 25 and are in contact in a thermally conducting manner with cover 27 and wall 25.

Because of the temperature difference between the fluid, which later flows through flow channel 40, and the fluid flowing around thermoelectric device 1 from the outside, thermal stresses arise in the thermoelectric device. In particular, thermoelectric elements 20 and their conductive bridges 21 react especially sensitively to mechanical stress. It is advantageous therefore to protect the thermoelectric elements 20 from mechanical effects as much as possible.

The damage to thermoelectric device 1 can be favorably influenced, e.g., by advantageous size dimensioning. The longer the section of thermoelectric device 1 exposed to the fluid, the greater the total expansion of thermoelectric device 1. To minimize the expansion further, it is advisable to use materials with a low expansion coefficient, particularly on the hot side of thermoelectric module 2, 39.

In addition to limiting the structural dimensions of thermoelectric device 1 and the use of suitable materials, the described above introduction of cutouts or expansion joints, therefore the partial interruption of the housing of thermoelectric modules 2, 39, can also be used as a third option.

Figure 9:
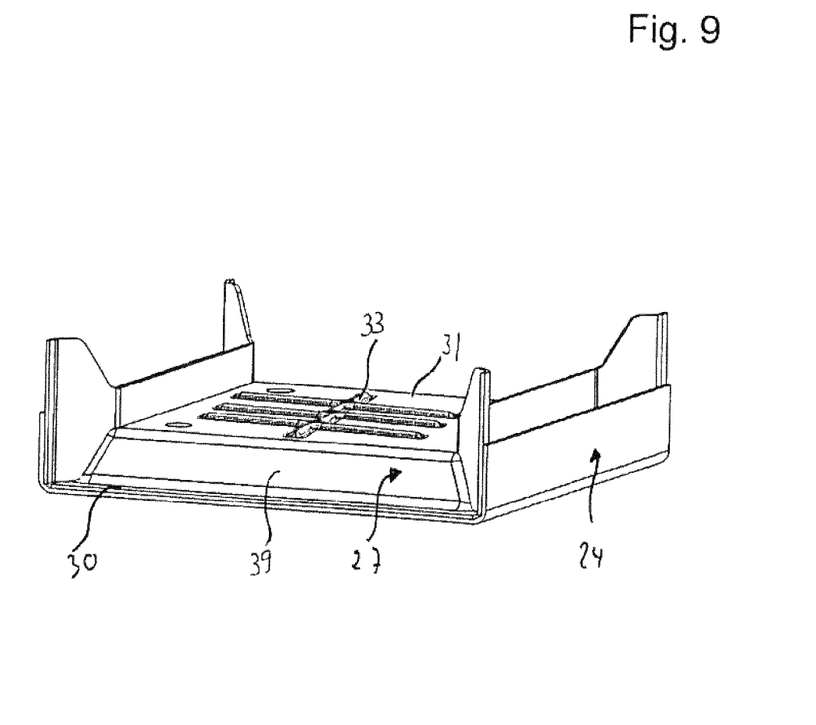
FIG. 9 shows a development of the embodiment of FIG. 8, whereby the cutout is closed fluid-tight with a sealing element.

FIG. 9 shows a further development of the thermoelectric device from that shown in FIG. 8. In addition to cutout 32 in wall 31 of cover 27, a sealing element 33, which is to protect thermoelectric element 20 from the fluid that will later flow through flow channel 40, is attached to walls 31.

Sealing element 33 is preferably made here of a thin-walled material for closing cutout 32 fluid-tight and nonetheless retain a sufficiently high flexibility, in order to be able to reduce arising thermal stresses.

Sealing element 33 is represented by a deep-drawn metal part in FIG. 9. In alternative embodiments, the use of thin metal films, for example, can also be provided. The sealing element can also be attached to the side of wall 31, the side facing away from flow channel 39.

Figure 10:
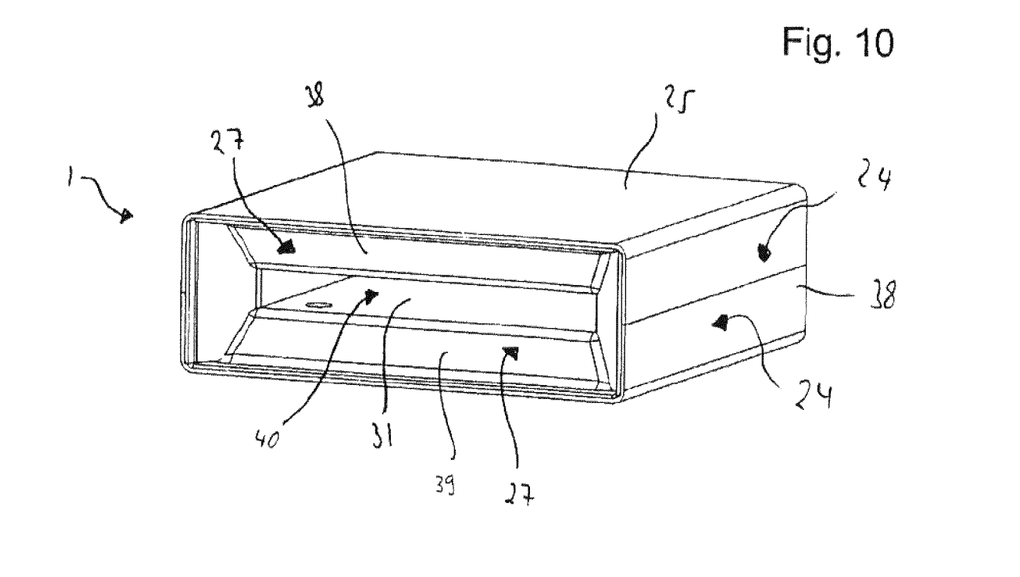
FIG. 10 shows a development of the thermoelectric device from FIGS. 6 to 9 with the top part of the flat tube and covers that have no cutout toward the flow channel.

FIG. 10 shows a further development of thermoelectric device 1. In FIG. 10, a second U-shaped flat tube piece 24 is placed from above on the structure already known from FIGS. 7 to 9. The U-shaped flat tube pieces 24 are connected to one another at their junctions and thus form flat tube 38.

The top U-shaped flat tube piece 24 also has in the interior on its wall 25 an arrangement of thermoelectric elements 20, which are connected to one another via conductive bridges 21. A cover 27, which together with the U-shaped flat tube piece 24 forms the housing for thermoelectric elements 20, is also placed on the top U-shaped flat tube piece 24. The structures of the top U-shaped flat tube piece 24 and of the bottom U-shaped flat tube piece 24 correspond completely to one another.

With the top U-shaped flat tube piece 24 and the bottom U-shaped flat tube piece 24, side walls 22 now form a complete diffuser from inflow inclines 28a, 28b both in the inflow region and outflow region of thermoelectric device 1.

Flat tube 38 of thermoelectric device 1 in FIG. 10, apart from being the outer boundary of thermoelectric device 1, thus is also simultaneously part of the housing of both thermoelectric modules 39, which are formed by cover 27 and walls 25.

The elements, cover 27, U-shaped flat tube piece 24, and side wall 22, are constructed largely from the same material and can be connected together by methods such as welding, gluing, or soldering.

Flow channel 40 is formed between wall 31 of top cover 27 and wall 31 of bottom cover 27 and lateral side walls 22.

A second medium, differing in temperature from the first fluid, can then flow around the outer contours of the thermoelectric device. This creates a temperature gradient between the top and bottom walls 31 of flow channel 40 and the outer interfaces of wall 25 of thermoelectric device 1.

Figure 11:
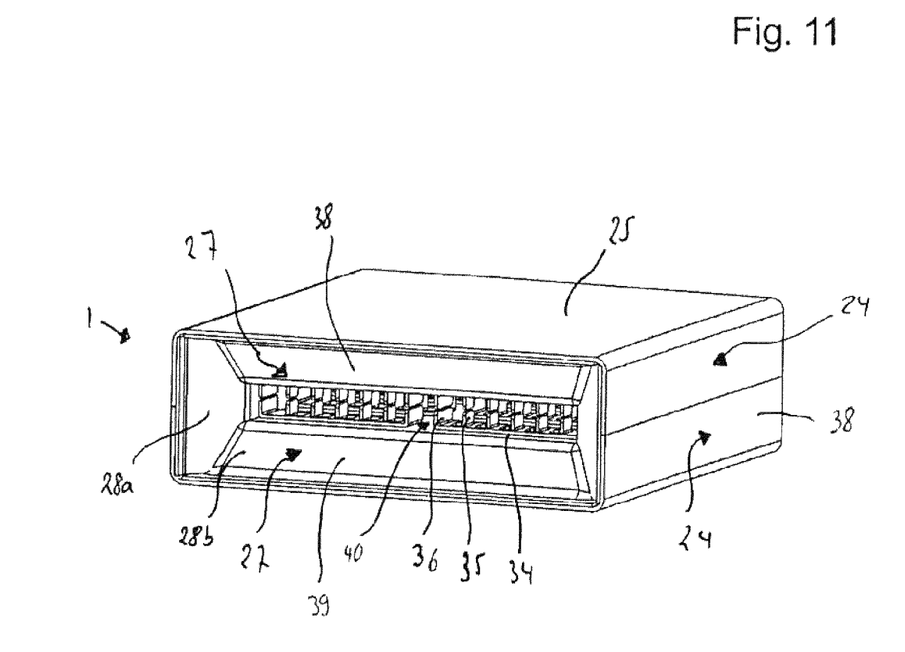
FIG. 11 shows a development of the thermoelectric device from FIG. 10, whereby flow resistance elements are arranged within the flow channel.

FIG. 11 shows a further development of thermoelectric device 1 already shown in FIG. 10. In addition, flow resistance elements 34 are now introduced into flow channel 40. The flow resistance elements 34 in the form shown in FIG. 11 has material strips, from which tabs 35 are bent out. The edge regions of the material strips are also raised and thus project into flow channel 40. These material strips are attached to the surface facing flow channel 40 of wall 31 and thereby project into flow channel 40. As a departure from flow resistance elements 34 shown in FIG. 11, conventional fin structures can also be used.

When an alternative fin structure is used, care must be taken to produce the lowest possible thermal resistance between the fluid within flow channel 40 and thermoelectric elements 20 below cover 27.

Figure 12:
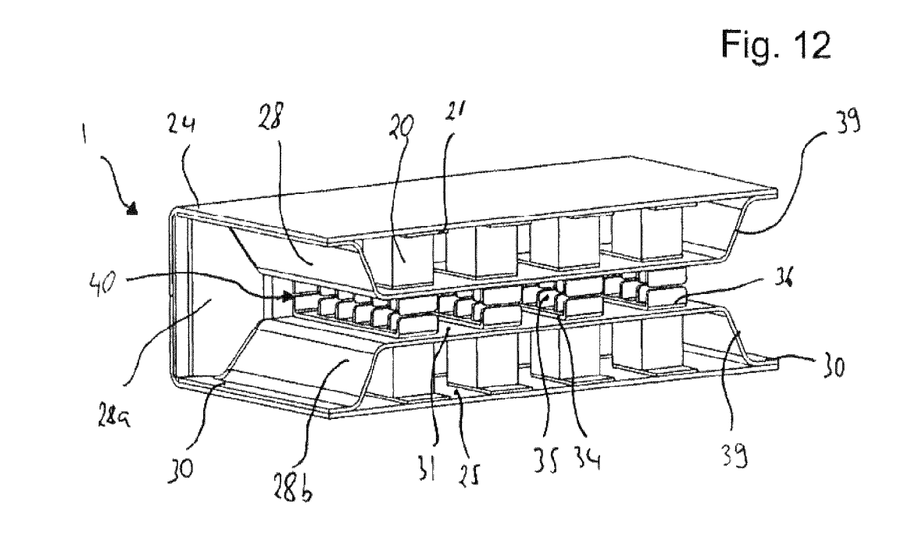
FIG. 12 shows a cut through the central plane of the flow channel of a thermoelectric device, as it is shown in FIG. 11.

FIG. 12 shows a cut through a central plane along flow channel 40 through thermoelectric device 1 already shown in FIG. 11. The stack-like structure of thermoelectric device 1 is visible especially well in FIG. 12. A plurality of thermoelectric elements 20, which are connected electrically to one another with conductive bridges 21, are arranged on bottom wall 25 of bottom U-shaped flat tube piece 24.

As a result, the thermoelectric elements are in thermally conductive contact with outer wall 25 of U-shaped flat tube piece 24. The top boundary of the thermoelectric element is formed by cover 27 or via wall 31 of cover 27, which is connected via its peripheral flange region 30 to wall 25 of the bottom region of U-shaped flat tube piece 24.

The top region of the thermoelectric device shown in FIG. 12 is constructed similar to the bottom part. Flow resistance elements 34 are arranged in flow channel 40 formed between walls 31 and side walls 22, as was already shown in FIG. 11.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A thermoelectric device comprising:
a flat tube;
at least one first thermoelectric module having a housing with at least two opposite first walls; and
a plurality of thermoelectric elements arranged between the first walls of the housing, the thermoelectric elements having opposite surfaces, which in each case are in thermal contact with one of the first walls of the housing of the first thermoelectric module,
wherein the flat tube has at least two opposite second walls,
wherein the first thermoelectric module is arranged in an interior of the flat tube, and with one of the first walls thereof is in thermal contact with one of the second walls of the flat tube,
wherein the first thermoelectric module is connected via side walls to a housing of a second thermoelectric module,
wherein a flow channel through which a first fluid is adapted to flow, is formed between the housing of the first thermoelectric module, the side walls and the housing of the second thermoelectric module,
wherein the side walls form a thermal decoupling element and each include a first portion, a second portion and a third portion,
wherein the first portion of each of the sidewalls is provided at a position upstream of the thermoelectric elements arranged in the first thermoelectric module in a fluid flow direction of the first fluid, the second portion of each of the sidewalls is aligned with the thermoelectric elements in the first thermoelectric module in the fluid flow direction of the first fluid, and the third portion of each of the side walls is provided at a position downstream of the thermoelectric elements arranged in the first thermoelectric module in the fluid flow direction of the first fluid,
wherein the first portion and the third portion of each of the sidewalls are each inclined to form linear, lateral inclined portions, the first portion provided at an upstream end of the second portion and the third portion provided at a downstream end of the second portion of each of the sidewalls, and
wherein the housing of the first thermoelectric module has at least two opposite third walls, wherein a linearly inclined cover is arranged at each of the at least two opposite third walls at a position upstream and a position downstream of the thermoelectric elements arranged in the first thermoelectric module, such that, at the positions upstream and downstream of the thermoelectric elements arranged in the first thermoelectric module, in the fluid flow direction of the first fluid, the linearly inclined covers form upper or lower inclined portions.

2. A thermoelectric device comprising:
a flat tube;
a first thermoelectric module;
a second thermoelectric module, the first and second thermoelectric modules each have a housing with at least two opposite first walls; and
a plurality of thermoelectric elements arranged between the first walls of the housing, the thermoelectric elements having opposite surfaces, which in each case are in thermal contact with one of the first walls of the housing of the respective thermoelectric module,
wherein the flat tube has at least two opposite second walls, wherein the first and second thermoelectric modules are arranged in an interior of the flat tube and with one of first walls thereof are in thermal contact with one of the second walls of the flat tube, wherein the first and second thermoelectric modules are connected to one another via side walls, wherein the first and second thermoelectric modules form a flow channel through which a first fluid is adapted to flow between the housing of the first and second thermoelectric modules and the side walls, wherein the side walls form a thermal decoupling element and each include a first portion, a second portion and a third portion, wherein the first portion of each of the sidewalls is provided at positions a position upstream of the thermoelectric elements arranged in the first and second thermoelectric modules in a fluid flow direction of the first fluid, the second portion of each of the sidewalls is aligned with the thermoelectric elements in the first and second thermoelectric modules in the fluid flow direction of the first fluid, and the third portion of each of the sidewalls is provided at a position downstream of the thermoelectric elements arranged in the first and second thermoelectric modules in the fluid flow direction of the first fluid, wherein the first portion and the third portion of each of the sidewalls are each inclined to form linear, lateral inclined portions, the first portion provided at an upstream end of the second portion and the third portion provided at a downstream end of the second portion of each of the sidewalls, and wherein the housings of the first and second thermoelectric modules have at least two opposite third walls, wherein a linearly inclined cover is arranged at each of the at least two opposite third walls of each housing at a position upstream and downstream of the thermoelectric elements arranged in the first and second thermoelectric modules, such that, at the positions upstream and downstream of the thermoelectric elements arranged in the first and second thermoelectric modules, in the fluid flow direction of the first fluid, the linearly inclined covers form upper or lower inclined portions.

3. The thermoelectric device according to claim 1, wherein the other of the first walls of the housing of the first thermoelectric module that faces the flow channel has a cutout, and wherein the cutout is closed fluid-tight via a sealing element.

4. The thermoelectric device according to claim 1, wherein the other of the first walls of the housing of the first thermoelectric module that faces the flow channel has flow resistance elements projecting into the flow channel.

5. The thermoelectric device according to claim 1, wherein the thermoelectric elements are connected in series via conductive bridges, and wherein the conductive bridges are arranged between the thermoelectric elements and the first walls of the housing.

6. The thermoelectric device according to claim 1, wherein the one of the first walls of the housing faces away from the flow channel, and
wherein the one of the first walls of the housing and the one of the second walls of the flat tube are formed separated from one another and are in thermal contact to one another, or, the one of the first walls of the housing and the one of the second walls of the flat tube are formed as a unit.

7. The thermoelectric device according to claim 1, wherein the second walls of the flat tube each have a cutout.

8. The thermoelectric device according to claim 1, wherein the flat tube is formed as a single piece.

9. The thermoelectric device according to claim 1, wherein the flat tube is formed from a plurality of substantially plate-like elements in a stacked configuration.

10. An arrangement of one or more thermoelectric devices according to claim 1 in a heat exchanger, wherein a first fluid flows through the flow channel and a second fluid flows around the flat tube on its outer walls facing away from the flow channel.

11. The thermoelectric device according to claim 3, wherein the cutout in the other of the first walls of the housing of the at least one thermoelectric module that faces the flow channel is formed in a plurality of lines that extend both parallel and perpendicular to a flow direction of the first fluid.

12. The thermoelectric device according to claim 1, further comprising at least one electrical connection site by which the first thermoelectric module can be electrically connected, the at least one electrical connection site being provided in the other of the first walls of the housing of the first thermoelectric module that faces the flow channel.

13. The thermoelectric device according to claim 1, wherein the first portion, the second portion and the third portion of each sidewall, respectively, are integrally connected.

14. The thermoelectric device according to claim 2, wherein the first portion, the second portion and the third portion of each sidewall, respectively, are integrally connected.

* * * * *